(12) United States Patent
Gold et al.

(10) Patent No.: US 9,269,149 B2
(45) Date of Patent: Feb. 23, 2016

(54) CALIBRATION OF A DIRECT-IMAGING SYSTEM

(71) Applicant: Orbotech Ltd., Yavne (IL)

(72) Inventors: Uri Gold, Rishon Lezion (IL); Ram Oron, Nes Ziona (IL)

(73) Assignee: Orbotech Ltd., Yavne (IL)

( * ) Notice: Subject to any disclaimer, the term of this patent is extended or adjusted under 35 U.S.C. 154(b) by 0 days.

(21) Appl. No.: 14/272,745

(22) Filed: May 8, 2014

(65) Prior Publication Data
US 2015/0324968 A1    Nov. 12, 2015

(51) Int. Cl.
*B41J 2/435*    (2006.01)
*B41J 2/47*    (2006.01)
*G06T 7/00*    (2006.01)

(52) U.S. Cl.
CPC ............. *G06T 7/004* (2013.01); *G06T 7/0004* (2013.01); *G06T 2207/30164* (2013.01)

(58) Field of Classification Search
USPC ......................... 347/224, 225, 233, 239, 255; 219/121.6, 121.66, 121.76, 121.78, 219/121.79, 121.82
See application file for complete search history.

(56) References Cited

U.S. PATENT DOCUMENTS

| | | | |
|---|---|---|---|
| 5,473,409 A * | 12/1995 | Takeda et al. | 355/53 |
| 5,841,520 A | 11/1998 | Taniguchi | |
| 6,198,791 B1 | 3/2001 | He et al. | |
| 6,430,465 B2 * | 8/2002 | Cutler | 700/193 |
| 6,489,985 B1 * | 12/2002 | Brodsky et al. | 347/247 |
| 6,560,248 B1 | 5/2003 | Vernackt | |
| 6,809,290 B2 | 10/2004 | Gross et al. | |
| 6,819,789 B1 | 11/2004 | Kantor et al. | |
| 6,882,899 B2 | 4/2005 | Baldwin et al. | |
| 7,046,266 B1 | 5/2006 | Retschke et al. | |
| 8,305,409 B2 | 11/2012 | Sirton et al. | |
| 8,390,795 B2 | 3/2013 | Kotler et al. | |
| 2003/0180983 A1 * | 9/2003 | Oswald et al. | 438/57 |
| 2004/0017429 A1 * | 1/2004 | Liu et al. | 347/47 |
| 2006/0103827 A1 | 5/2006 | Derksen | |
| 2006/0252261 A1 * | 11/2006 | Tanaka et al. | 438/662 |
| 2008/0017619 A1 * | 1/2008 | Yamakawa et al. | 219/121.81 |
| 2010/0016995 A1 | 1/2010 | Barat | |
| 2010/0328643 A1 | 12/2010 | Kotler et al. | |
| 2011/0222074 A1 | 9/2011 | Svensson et al. | |
| 2013/0003065 A1 | 1/2013 | Shah et al. | |
| 2013/0044360 A1 | 2/2013 | Heinemann et al. | |

FOREIGN PATENT DOCUMENTS

WO    2010/042833 A1    4/2010

OTHER PUBLICATIONS

Communication dated Sep. 7 2015, issued by the International Searching Authority in counterpart International Application No. PCT/IL2015/000022.

* cited by examiner

*Primary Examiner* — Hai C Pham
(74) *Attorney, Agent, or Firm* — Sughrue Mion, PLLC (57) ABSTRACT

Optical apparatus includes a mount, which holds a workpiece. An array of optical heads project respective patterns of radiation onto the workpiece. A calibration assembly captures images of the respective patterns. A motion assembly, on which the calibration assembly is mounted, transports the calibration assembly among a plurality of different positions between the array of the optical heads and the mount so as to intercept and image, at each of the different positions, a respective pattern projected by a different one of the optical heads. A processor processes the images captured by the calibration assembly at the different positions so as to monitor operation of the apparatus.

23 Claims, 7 Drawing Sheets

CALIBRATION OF A DIRECT-IMAGING SYSTEM

FIELD OF THE INVENTION

The present invention relates generally to optical systems, and particularly to methods and apparatus for calibration of systems that irradiate a workpiece with multiple optical beams.

BACKGROUND

In Direct Imaging (DI) systems, a scanning beam is used to directly write an image, one or more pixels at a time, onto an exposure surface such as a photoresist. In systems that are known in the art, the image is typically created by modulating a scanning beam based on stored image data. The modulated beam is scanned in a raster pattern as the exposure surface (or scanning beam) advances in a scan direction.

Some DI systems use multiple beams in parallel to increase writing speed. For example, U.S. Pat. No. 7,046,266 describes a method of scanning for writing a pattern on a surface, including providing a scanning beam comprising a plurality of independently addressable sub-beams, which scan the surface side-by-side in the cross-scan direction. Each sub-beam is modulated to reflect information to be written, and the beams are overlapped in successive scans in the cross-scan direction such that all written areas of the surface are written on during at least two scans.

SUMMARY

Embodiments of the present invention that are described hereinbelow provide apparatus and methods for calibration of an optical irradiation system.

There is therefore provided, in accordance with an embodiment of the present invention, optical apparatus, including a mount, which is configured to hold a workpiece. An array of optical heads are configured to project respective patterns of radiation onto the workpiece. A calibration assembly is configured to capture images of the respective patterns. A motion assembly, on which the calibration assembly is mounted, is configured to transport the calibration assembly among a plurality of different positions between the array of the optical heads and the mount so as to intercept and image, at each of the different positions, a respective pattern projected by a different one of the optical heads. A processor is configured to process the images captured by the calibration assembly at the different positions so as to monitor operation of the apparatus.

In a disclosed embodiment, the motion assembly is configured to transport the calibration assembly among the plurality of the different positions during a calibration procedure, and to transport the calibration assembly after the calibration procedure to a rest location, where the calibration assembly does not intercept the patterns projected by any of the optical heads.

The optical heads may be arrayed in multiple parallel rows, while the motion assembly is configured to shift the calibration assembly in directions both parallel and perpendicular to the rows.

In some embodiments, the optical heads project the respective patterns along respective optical axes toward the workpiece, and the calibration assembly includes a calibration camera, having a camera optical axis non-parallel to the optical axes of the optical heads, and a reflector, which is configured to intercept the optical axes of the optical heads and to deflect the projected patterns toward the camera. Typically, the optical heads have a focal plane at the workpiece, and the calibration camera includes an image sensor, and the reflector and the calibration camera are positioned so that the image sensor is located in the focal plane of the optical heads.

In one embodiment, the apparatus includes a registration target, which is fixed to the mount in the focal plane of the optical heads and is configured to respond to the radiation projected by the optical heads, and a registration camera, which is positioned to capture a registration image of the registration target, and the processor is configured to process the registration image so as to calibrate respective positions of the optical heads.

In a disclosed embodiment, the calibration camera has a camera axis that is perpendicular to a plane of the image sensor, and the reflector is configured to deflect the projected patterns to impinge on the image sensor along a deflected axis that is slanted relative to the camera axis. The motion assembly may be configured to shift the calibration camera in a direction transverse to the deflected axis, so that the calibration camera captures the images of the projected pattern from each optical head at multiple transverse locations, wherein the processor is configured to process the images captured at the multiple transverse locations so as to assess a focal property of the projected pattern.

Typically, the respective patterns are characterized by a pattern pixel size, and the calibration assembly includes a calibration camera, which may be configured to form images of the patterns having an image pixel size that is no greater than the pattern pixel size.

Additionally or alternatively, the calibration assembly further includes a power meter, which is configured to measure an intensity of the projected radiation.

There is also provided, in accordance with an embodiment of the present invention, optical apparatus, which includes a mount, which is configured to hold a workpiece. An array of optical heads are configured to project respective patterns of radiation onto the workpiece. A registration target, including an erasable photochromic element, is located on the mount and is configured to respond to the radiation projected by the optical heads. A registration camera is positioned to capture an image of the registration target. A processor is configured to process the image so as to calibrate respective positions of the patterns projected by the optical heads relative to the workpiece.

There is additionally provided, in accordance with an embodiment of the present invention, a method for calibration of optical apparatus that includes a mount, which holds a workpiece, and an array of optical heads, which project respective patterns of radiation onto the workpiece. The method includes capturing, using a calibration assembly, images of the respective patterns projected by the optical heads. The calibration assembly is transported among a plurality of different positions between the array of the optical heads and the mount, so that the calibration assembly intercepts and images, at each of the different positions, a respective pattern projected by a different one of the optical heads. The images captured by the calibration assembly at the different positions are processed so as to monitor operation of the apparatus.

There is further provided, in accordance with an embodiment of the invention, a method for calibration of optical apparatus that includes a mount, which holds a workpiece, and an array of optical heads, which project respective patterns of radiation onto the workpiece. The method includes placing on the mount a registration target, including an erasable photochromic element, which is configured to respond to the radiation projected by the optical heads. An image of the registration target is captured and processed so as to calibrate respective positions of the patterns projected by the optical heads relative to the workpiece.

The method may include erasing and reusing the photochromic element after capturing the image.

The present invention will be more fully understood from the following detailed description of the embodiments thereof, taken together with the drawings in which:

DETAILED DESCRIPTION OF EMBODIMENTS

To increase throughput in production applications, DI systems may write simultaneously with multiple beams. These beams may be generated by a single optical head or, for even greater writing speed, by multiple optical heads, each with its own radiation source. Multi-head DI machines are sensitive to faults, particular since a fault in even a single head may mean that the entire machine is unusable until repaired. It is therefore desirable that such machines include on-board diagnostics, in order to detect and classify faults and facilitate service and replacement of parts when needed.

Embodiments of the present invention that are described hereinbelow provide an on-board calibration assembly for a DI machine that meets the above needs. The calibration assembly monitors the performance of multiple optical heads and also enables on-machine alignment and adjustment of the optical heads (for proper image size, position, focus, and illumination properties). The calibration assembly can be used both during machine integration and for service in the field. It supports automated correction of minor faults in the optical heads, such as image position shifts and power degradation, so as to maintain machine performance while interfering only minimally or not at all with normal machine operation.

Some embodiments of the present invention provide optical apparatus, such as a multi-head DI machine, in which a mount holds a workpiece, and an array of optical heads project respective patterns of radiation onto the workpiece. A calibration assembly, which is configured to capture images of the respective patterns, is mounted on a motion assembly, which transports the calibration assembly among different positions between the array of the optical heads and the mount. At each position, the calibration assembly intercepts and images the respective pattern projected by a different optical head. A processor processes these images in order to monitor operation of the apparatus.

Typically, after the calibration procedure, the motion assembly transports the calibration assembly to a rest location, where the calibration assembly does not intercept the patterns projected by any of the optical heads. The calibration assembly remains in this rest location while the optical heads project their images on the workpiece, and thus does not interfere with the normal operation of the apparatus. The calibration and motion assemblies are then activated when needed between processing of workpieces—either by an operator of the apparatus or automatically by the processor—in order to check the calibration and operation of the optical heads.

In some embodiments, the calibration assembly comprises a calibration camera, having an optical axis that is non-parallel (for example, perpendicular) to the optical axes of the optical heads. A reflector intercepts the optical axes of the optical heads and deflects the projected patterns toward the camera. Typically, the calibration camera comprises an image sensor, and the reflector and the calibration camera are positioned so that the image sensor is located in the focal plane of the optical heads, i.e., at the same optical distance from the optical heads as the workpiece itself.

The reflector may be oriented to deflect the projected patterns so that they impinge on the image sensor along a deflected axis that is slanted relative to the camera axis. The motion assembly then shifts the camera so that the camera captures the images of the projected pattern from each optical head at multiple locations distributed transversely relative to the deflected axis. This arrangement enables the processor to assess focal properties of the projected patterns. In other words, by virtue of the transverse motion of the camera with respect to the axis, the processor is able to map the projected patterns in three dimensions, i.e., to evaluate both the transverse distribution of the pattern in the focal plane and lateral variations along the focal axis, perpendicular to this plane.

In some embodiments, a registration target is fixed to the mount in the focal plane of the optical heads. The registration target responds to the radiation projected by the optical heads, for example by photochromically darkening when irradiated by the beam from an optical head. (Photochromic materials are advantageous for this purpose, since they may be erased for reuse simply by heating; but other radiation-responsive targets may alternatively be used.) A registration camera, which is positioned in a known position relative to the optical heads, captures images of the registration target. The processor processes these images in order to calibrate the respective positions of the patterns projected by the optical heads and thus to correct for deviations in head location and orientation.

The registration target and camera may be used independently of or in conjunction with the calibration assembly described above. In the latter case, both the calibration camera and the registration camera capture images at the focal plane of the optical heads, with the image sensor of the calibration camera actually in the focal plane, while the registration camera images an object—the registration target—that is located in the focal plane. The calibration assembly and the registration assembly (target and camera) thus operate in concert to give a complete, accurate picture of the alignment and performance of the optical heads and to enable rapid diagnosis and correction of any deviations.

Although the embodiments described herein make reference specifically to a DI machine of a certain type and configuration, calibration and registration assemblies based on the principles of these embodiments may similarly be used in other sorts of optical apparatus that operate by projecting patterned radiation onto a surface.

Figure 1:
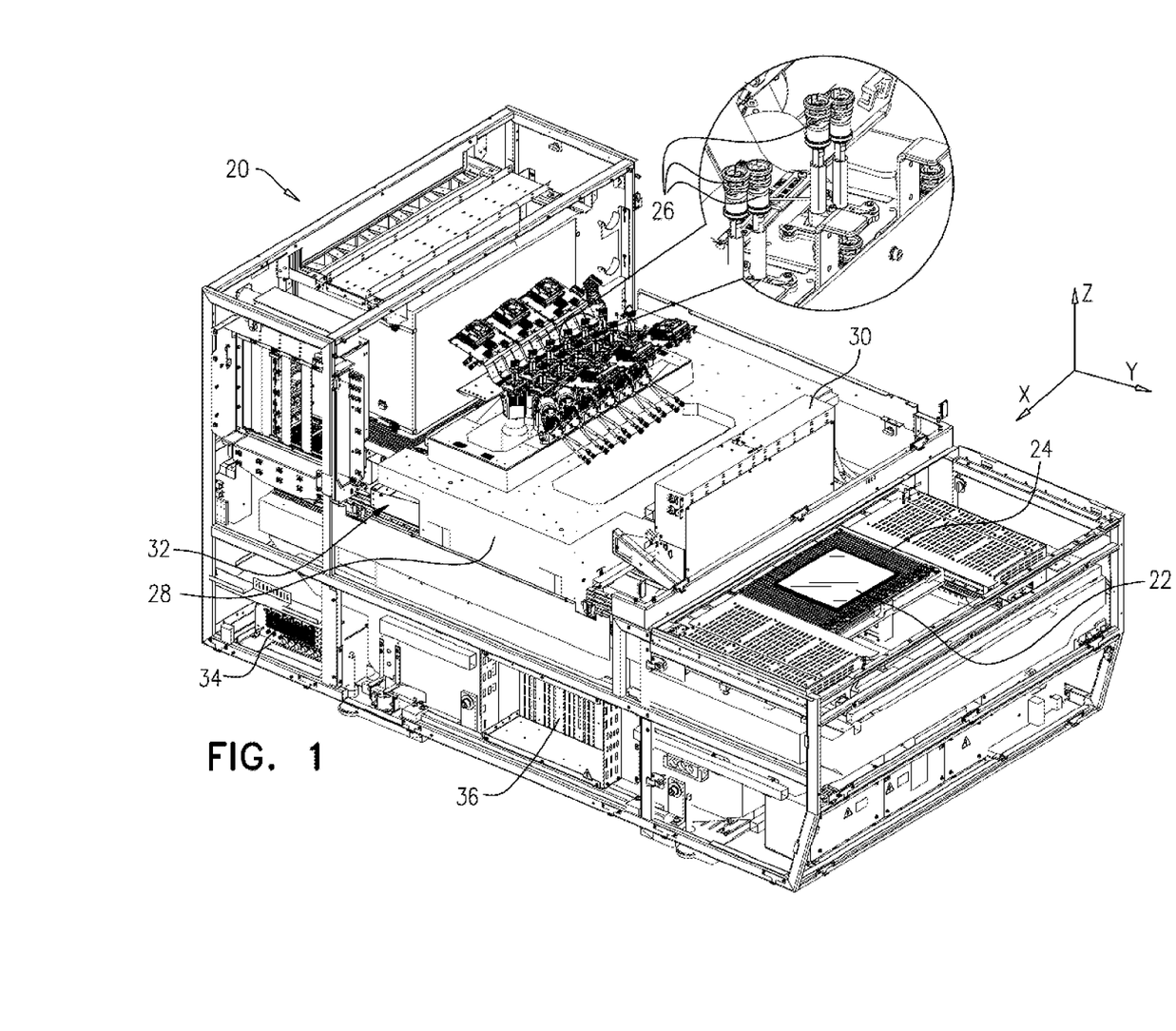
FIG. 1 is a schematic, pictorial illustration of a multi-head direct-imaging (DI) machine with a calibration assembly, in accordance with an embodiment of the present invention.

FIG. 1 is a schematic, pictorial illustration of a multi-head direct-imaging (DI) machine 20 with a calibration assembly 32, in accordance with an embodiment of the present invention. Machine 20 writes patterns on a panel 22 mounted on a movable table 24, which transports panel 22 along the Y-direction, as marked in the figure. (In normal operation, panel 22 and table 24 are covered by closed doors, but these doors are omitted from this figure in order to show the panel and table.) Panel 22 may comprise, for example, a dielectric substrate overlaid with a layer of photoresist, which is exposed by machine 20. In this example, in other words, panel 22 is the workpiece, while table 24 serves as a mount.

For writing on panel 22, machine 20 comprises multiple optical heads 26, which are mounted over table 24 on a fixed bridge 28. Optical heads 26 may be arrayed in multiple parallel rows. For example, in machine 20, twelve heads are arranged in two staggered rows, each containing six heads, but the principles of this embodiment are equally applicable to other arrays of optical heads, having larger or smaller numbers of heads in any suitable geometrical arrangement. Each optical head generates and projects a patterned image onto panel 22. For this purpose, the heads may comprise, for example, high-intensity light-emitting diodes (LEDs) as illumination sources with addressable digital micromirror devices (DMDs) for creating the patterns and suitable projection optics. Alternatively, heads 26 may comprise light sources of other sorts, such as laser diodes or ultraviolet lamps. The design and detailed functionality of the optical heads, however, are beyond the scope of the present disclosure. Furthermore, the principles of the present invention are similarly applicable, mutatis mutandis, to other sorts of light sources and imaging matrices, as well as to machines in which the optical heads project their respective patterns by scanning a writing beam over the image area.

As table 24 transports panel 22 below bridge 28, the patterns projected by optical heads 26 change continually to create the required overall exposure on the panel. The twelve optical heads in this embodiment cover the entire panel width, typically with a small overlap between neighboring heads, so that the entire panel can be exposed in one pass. Above panel 22, a registration assembly 30 comprises one or more registration cameras (shown in FIGS. 2-4), which are used to image the pattern already created on the panel so that the pattern projected by heads 26 can be aligned with the existing pattern on the panel. Registration assembly 30 may also be used to image alignment targets on table 24 for purposes of calibrating the alignment of heads 26, as described further with reference to the figures that follow.

A processor 34 controls the operation of machine 20, including performance of the calibration procedures that are described herein. Typically, processor 34 comprises a microprocessor with suitable interfaces, which is programmed in software to carry out these functions. Alternatively, these control and calibration functions may be performed by a separate, off-board computing and control unit (not shown). A power supply 36 provides electrical power to optical heads 26 and other components of machine 20.

Figure 2:
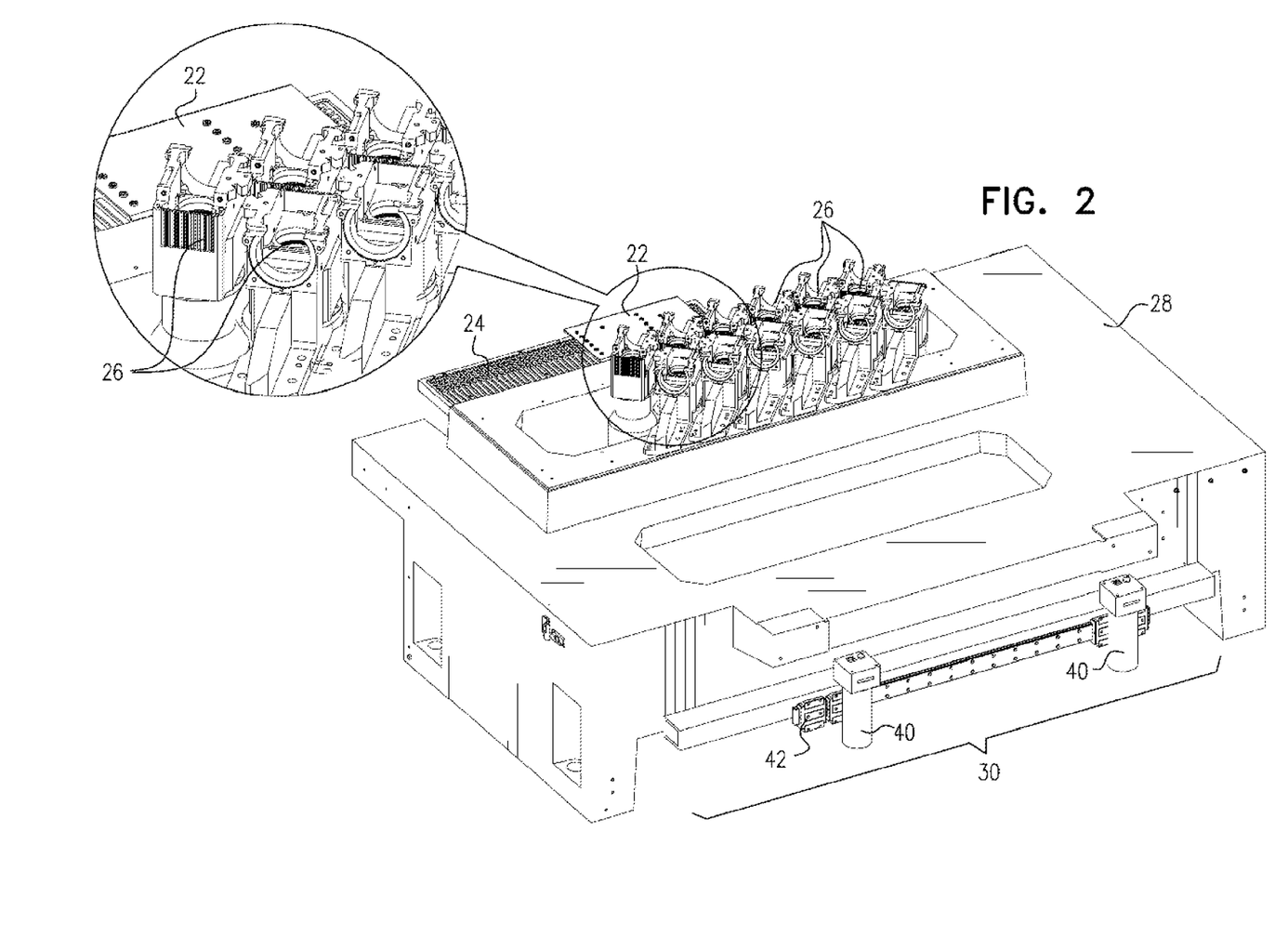
FIG. 2 is a schematic, pictorial illustration of an optical bridge in a multi-head DI machine, in accordance with an embodiment of the present invention.
Figure 3:
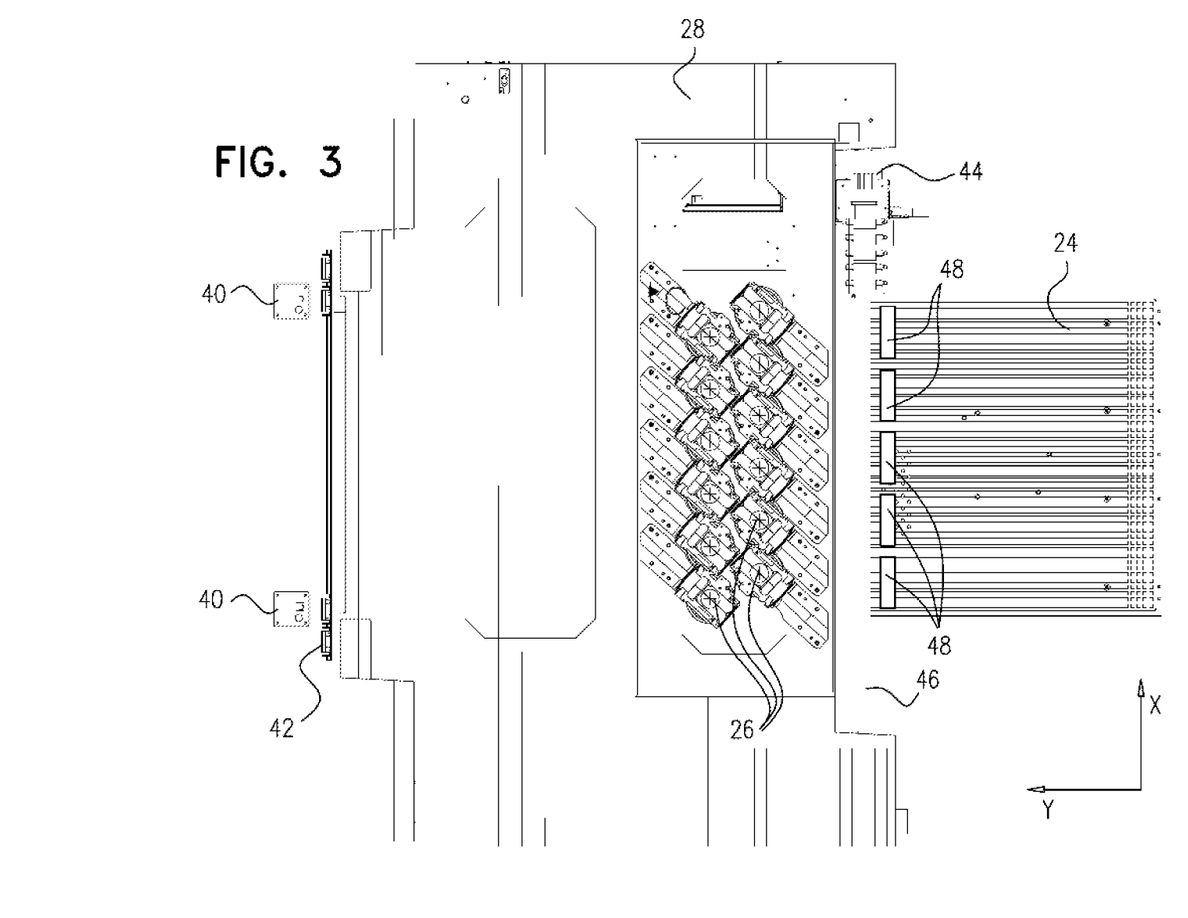
FIGS. 3 and 4 are schematic top and side views, respectively, of the optical bridge of FIG. 2.
Figure 4:
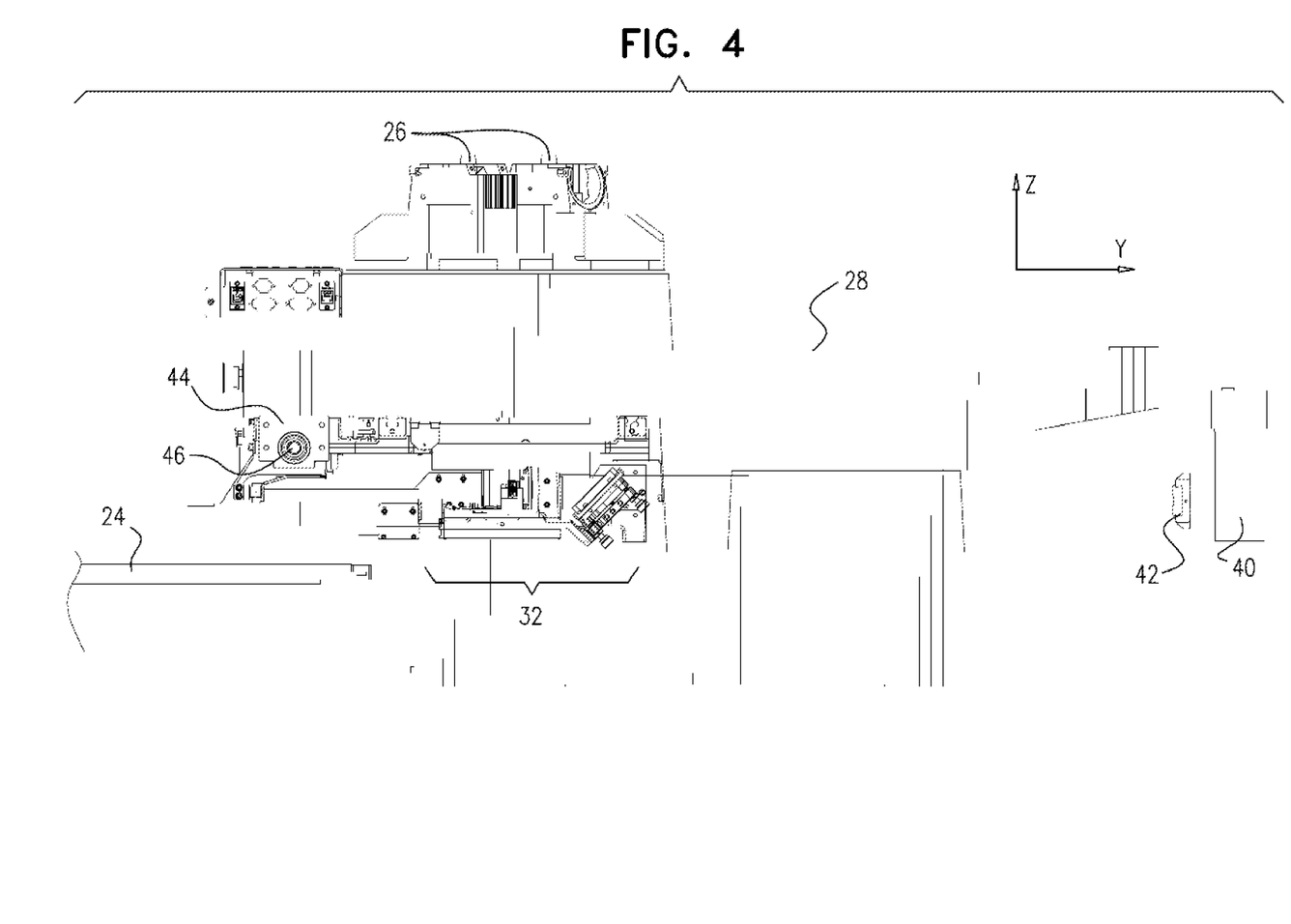

References is now made to FIGS. 2-4, which schematically show details of optical bridge 28 and other elements of DI machine 20, in accordance with an embodiment of the present invention. FIG. 2 is a pictorial illustration, while FIGS. 3 and 4 are schematic top and side views, respectively. These figures illustrate specifically the locations and operation of registration assembly 30 and calibration assembly 32, which together constitute the calibration system in machine 20.

This calibration system monitors the performance of optical heads 26, including aspects such as illumination intensity and uniformity, pattern generation, focus, and other optical measures. The calibration system also monitors the absolute and relative positions of the print areas of all optical heads. Processor 34 applies the results of these performance and position monitoring functions in controlling the operation of heads 26 during the process of writing on panel 22. These same results also enable on-machine alignment of optical heads 26, including adjustment of image size, position, focus, and illumination properties, for purposes of service and, when necessary, replacement of modules. The monitoring results are useful, as well, in reducing the complexity of alignment procedures during manufacturing of machine 20, thus allowing for shorter and more automated machine alignment process. The calibration system can be also used to monitor power degradation of the optical heads over time, so as to predict when replacement or maintenance of the optical heads will be needed.

Figure 5:
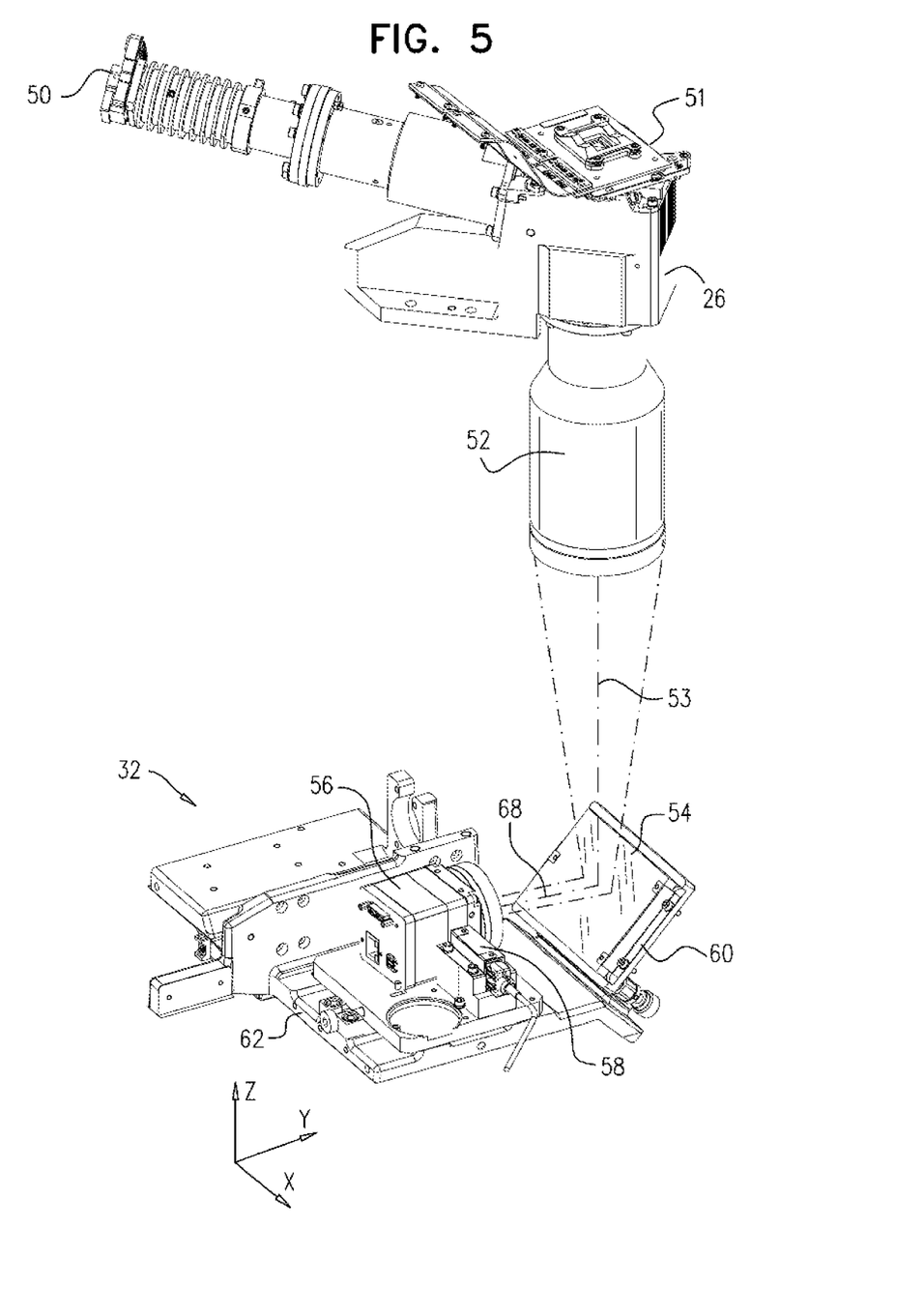
FIG. 5 is a schematic, pictorial illustration of an optical head and calibration assembly, in accordance with an embodiment of the present invention.

Calibration assembly 32 typically comprises one or more cameras and one or more power meters. (A typical configuration of this sort is shown in FIG. 5.) Alternatively, assembly 32 may comprise an integrated camera and power meter (for example, the BC106 camera beam profiler, produced by Thorlabs Inc., Newton, N.J. In either case, the camera images the pattern, or at least a part of the pattern, projected by each of optical heads 26. To cover the entire area of the patterns projected by the array of optical heads, which extends over the full width of table 24, a motion assembly 44, typically comprising a motorized drive, transports calibration assembly 32 along a track 46 that runs across bridge 28 in the X-direction (parallel to the rows of heads 26 and perpendicular to the direction of table movement). When optical heads 26 are arranged in multiple rows, as in machine 20, motion assembly 44 may also be configured to shift calibration assembly 32 in the Y-direction, in order to capture the patterns projected by the optical heads in all rows. Alternatively, the calibration assembly may comprise two (or more) cameras that are spaced apart in the Y-direction. When calibration assembly 32 is not in use, motion assembly moves it to a "parking" position at one of the sides of bridge 28, outside the beam areas of the optical heads.

Registration assembly 30 comprises one or more cameras 40, which are aligned and focused so as to image panel 22 on table 24 and may thus be used to identify the precise location of the panel before and during processing. Cameras 40 in this example are mounted on a track 42, allowing motion of the cameras in the X-direction. To enable processor 34 to detect inaccuracies in pattern position due to mechanical tolerances and misalignment of optical heads 26, dedicated targets 48 are fixed to table 24 at known locations. Targets 48 comprise a photochromic material which is activated by light, i.e., the targets turn dark where irradiated by optical heads 26. In the example shown in FIG. 3, five targets 48 are arrayed across table 24, arranged so as to form a strip that is about 25" long by 1.5" wide and extends over the entire panel width. Targets 48 may comprise a glass or ceramic substrate with a photochromic polymer layer (and a protective plastic layer covering it). The targets can be erased for reuse by heating them, typically to about 60° C. Alternatively, targets of other types, shapes, sizes and arrangement may be used for these purposes, as will be apparent to those skilled in the art.

Cameras 40 detect the response of targets 48 to the beams emitted by optical heads 26, and processor 34 uses these detection results in accurately measuring the relative positions of neighboring optical heads. Because of the high accuracy of motion of table 24, the measurements that are made at the registration target locations are sufficient to calibrate and control machine 20 over the entire range of movement of the table.

Figure 6:
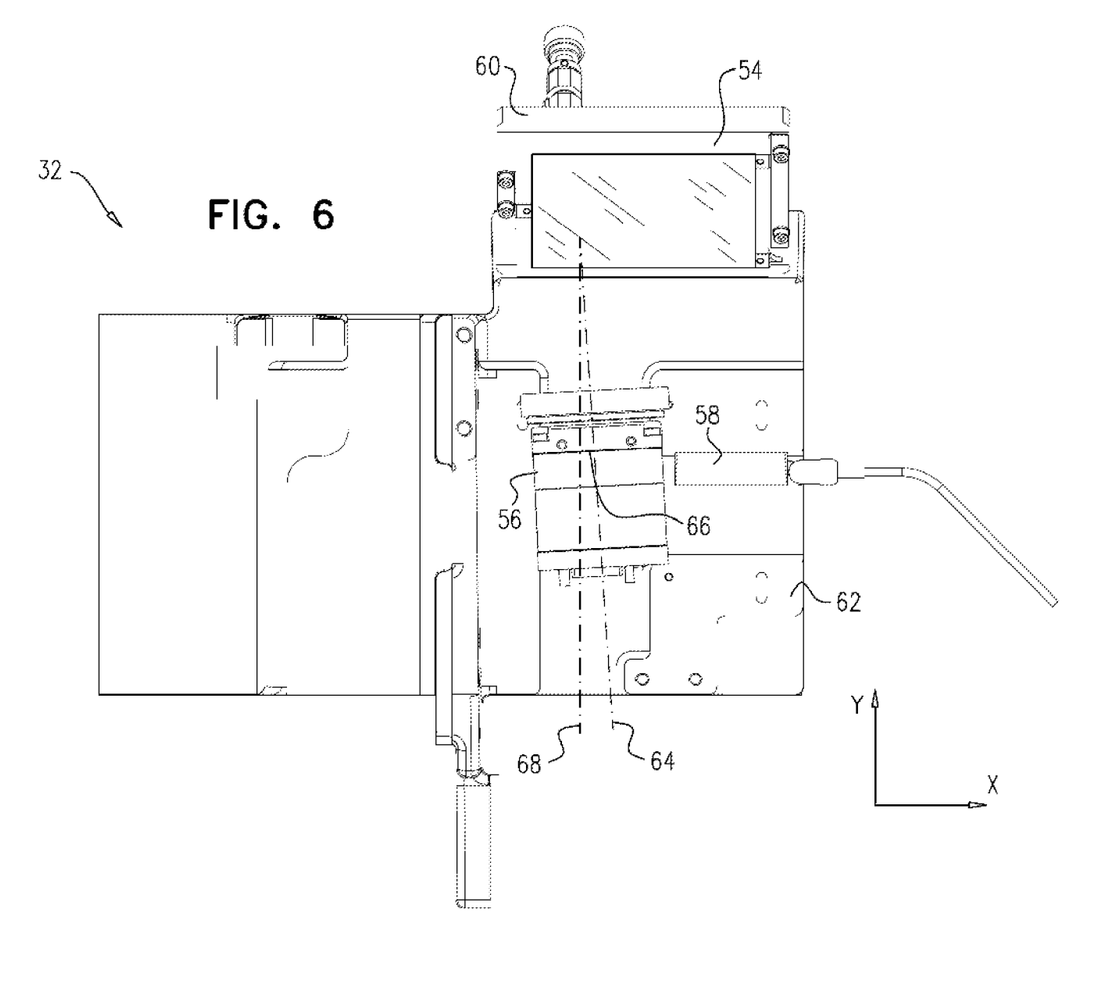
FIG. 6 is a schematic top view of the calibration assembly of FIG. 5.

Reference is now made to FIGS. 5 and 6, which schematically show details of calibration assembly 32, in accordance with an embodiment of the present invention. FIG. 5 is a schematic, pictorial illustration, which also shows features of optical head 26, while FIG. 6 is a schematic top view of the calibration assembly.

Optical head 26 in this example comprises a radiation source 50, such as an LED or array of LEDs, which outputs a radiation beam that reflects from a patterning element 51, such as a DMD, to form a pattern. This pattern is then focused by projection optics 52 along an optical axis 53 toward a focal plane at the surface of panel 22. In the configuration shown in FIG. 5, however, motion assembly 44 has shifted calibration assembly 32 so that a reflector 54 in the calibration assembly intercepts and deflects the patterned beam from optical head 26. Reflector 54 deflects the beam along a deflected axis 68 toward a camera 56, which captures an image of the projected pattern. Reflector 54 is held by an adjustable mount 60, which is typically adjusted so that deflected axis 68 is perpendicular to optical axis 53 of head 26, but may alternatively be set for different deflection angles.

Calibration assembly 32 also comprises an optical power meter 58, which measures the intensity of the incident radiation. Camera 56 and power meter 58 are mounted on a base 62, which may be positioned and adjusted by motion assembly 44 so that so that the beam from optical head 26 is incident on either the camera or the power meter as desired. Camera 56 may comprise, for example, a Genie TS-M3500 area camera produced by Teledyne DALSA Inc. (Waterloo, Ontario), while power meter 58 comprises a PD300 power sensor produced by Ophir Optronic Solutions Ltd. (Jerusalem, Israel).

Camera 56 comprises an image sensor 66 and is typically positioned so that the image sensor is located in the focal plane of the pattern projected by optical head 26. Alternatively, camera 56 may comprise objective optics to image the focal plane onto the image sensor. A camera axis 64 of camera 56, defined as the axis perpendicular to the plane of image sensor 66, is oriented obliquely relative to reflector 54 so that camera axis 64 is slanted relative to deflected axis 68 of the projected pattern. Typically, the slant angle between axes 64 and 68 is a few degrees (for example, 2-3°). Consequently, as motion assembly 44 shifts base 62 in the X-direction, transverse to deflected axis 68, and camera 56 thus captures images of the projected pattern at multiple transverse (X) locations relative to axis 68, a different part of the pattern will be in focus on image sensor 66 at each location. Specifically, a vertical stripe, running along the image sensor in the Z-direction, will be in focus, while areas on either side of the stripe will be out of focus.

The use of a slanted sensor is this manner is advantageous for a number of reasons: By processing the images captured at the different transverse locations, processor 34 is able to assess not only the transverse (X- and Y-direction) quality of the projected patterns, but also the lateral (Z-direction) focal properties. In other words, the processor is able to verify that the entire pattern is properly focused, and to detect focal defects, if they exist, without having to shift camera 56 along the beam axis in order to do so. This slanted configuration also relaxes the requirement that camera 56 be finely aligned relatively to optical heads 26, since the slant and transverse movement inherently compensate for any small misalignment.

Patterning element 51 forms a pattern with a certain pattern pixel size, and one object of calibration assembly 32 may be to find defective illumination pixels. For this purpose, the image pixel size of image sensor 66 in camera 56 should be no greater than the pattern pixel size {also referred to as the spot size}. For example, if patterning element 51 comprises a DMD having a pattern pixel size at the target of 20 μm, then as long as the image pixel size of image sensor 66 is smaller than 20 μm, camera 56 will be able to find every defective pixel in the DMD. Alternatively, if pixel-by-pixel diagnosis of optical head 26 is not required, the camera may have larger pixels. As noted earlier, camera 56 may comprise objective optics, which may be adjustable to vary the magnification of the projected pattern on the image sensor and thus effectively change the image pixel size.

Figure 7:
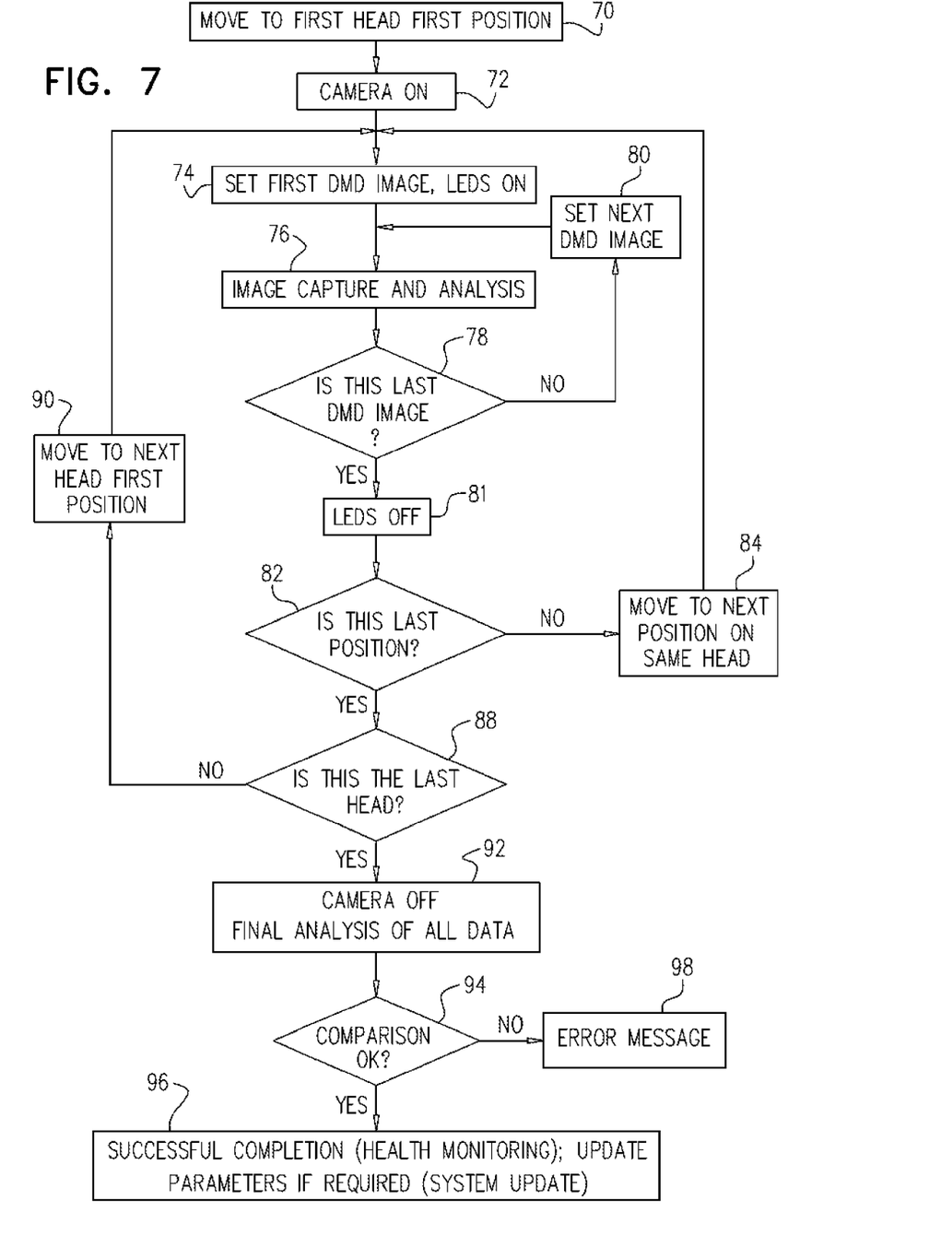
FIG. 7 is a flow chart that schematically illustrates a method for calibration of a multi-head DI machine, in accordance with an embodiment of the present invention.

FIG. 7 is a flow chart that schematically illustrates a method for calibration of machine 20, in accordance with an embodiment of the present invention. This method is presented as an example of how calibration assembly 32 may be used, but other modes of operation are also considered to be within the scope of the present invention. Specifically, the method described hereinbelow refers to testing the operation of LED radiation sources and DMD-based pattern generators in optical heads 26, but it may be adapted in a straightforward fashion to calibrate multi-head pattern projection machines of other types. The method may be performed automatically, as required, under the control of processor 34 or another system controller.

Processor 34 initiates the method by instructing motion assembly 44 to move calibration assembly 32 to its starting position, at a position initialization step 70. As explained above, for each optical head 26, camera 56 in calibration assembly 32 captures multiple images at different positions along the X-direction relative to axis 68. (Optionally, camera 56 may also be shifted in the X and/or Z-direction during calibration.) Camera 56 is moved to the first such position within the projection field of the first optical head at step 70. Processor 34 turns the camera on, to begin capturing images, at a camera activation step 72.

At each camera position, processor 34 typically instructs the optical head under test to generate a number of different test images, so that all of the pixels of the projected image can be checked. In each test image, a different set of the DMD mirrors will be switch to the "on" position, while the remaining mirrors are switched "off." Processor 34 sets the first DMD image and turns the LED radiation source on, at an image initiation step 74. Camera 56 captures an image of the projected image, and processor 34 analyzes the image, at an image analysis step 76. Typically, at this step, the processor verifies that the pattern in the image corresponds correctly to the pattern that the DMD was instructed to present, and that the image focal quality and other properties are within specified limits.

After receiving and processing the image at step 76, processor 34 checks whether any other DMD test images remain to be evaluated in the current camera position, at a last image checking step 78. If so, the processor proceeds to instruct the optical head under test to set and project the next test image, at an image advance step 80. Steps 76 and 78 are then repeated until all of the test images have been captured and evaluated in the current position.

After processing the last image in a given camera position, processor 34 turns the LED radiation source off, at a radiation shutoff step 81. The processor also checks whether images have been captured in all of the necessary camera positions to evaluate the current optical head, at a last position checking step 82. If not, the processor instructs motion assembly 44 to shift calibration assembly 32 to the next position, at a camera movement step 84. In this step, motion assembly may, for example, move the calibration assembly by a certain predefined increment along the Y-axis. Steps 74-81 are then repeated in this new position.

After capturing all required images in the last camera position for a given optical head 26, processor 34 checks whether the optical head just tested is the last one in machine 20 that needs to be evaluated, at a last head checking step 88. If not, processor 34 instructs motion assembly 46 to move calibration assembly 32 to the starting position for evaluation of the next optical head, at a head advance step 90. The processor then drives this head and the calibration and motion assemblies through steps 74-88 in order to check all of the test images at all the different applicable positions of the calibration assembly.

Finally, after determining at step 88 that the last optical head 26 has been evaluated, processor 34 turns camera 56 off and analyzes all of the data collected in the preceding steps, in a data analysis step 92. Typically, processor 34 compares the test results to a set of benchmarks, to determine whether the test performance of machine 20 is within specified limits, at a comparison step 94. If so, the processor makes a record of the "health" of machine 20, indicating that the test was completed successfully, at a completion step 96. If necessary, the processor may update system parameters, such as changing calibration parameters that it uses in adjusting the images projected by the different optical heads, in order to compensate for minor misalignment or variations in projected intensity.

On the other hand, if comparison step 94 indicates that any of the performance measures of machine 20 are outside specified limits, processor 34 issues an error message, at an error reporting step 98. Typically, the message is directed to an operator of machine 20, who may then interrupt operation of the machine and make whatever adjustments or repairs are needed.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optical apparatus, comprising:
   a mount, which is configured to hold a workpiece;
   an array of optical heads, which are configured to project respective patterns of radiation onto the workpiece;
   a calibration assembly, which is configured to capture images of the respective patterns;
   a motion assembly, on which the calibration assembly is mounted, and which is configured to move the calibration assembly, with respect to the array of optical heads, among a plurality of different positions, each position disposed on an optical path between the array of the optical heads and the mount, so as to intercept and image, at each of the different positions, a respective pattern projected by a different one of the optical heads; and
   a processor, which is configured to process the images captured by the calibration assembly at the different positions so as to monitor operation of the apparatus.

2. The apparatus according to claim 1, wherein the motion assembly is configured to move the calibration assembly among the plurality of the different positions during a calibration procedure, and to move the calibration assembly after the calibration procedure to a rest location, where the calibration assembly does not intercept the patterns projected by any of the optical heads.

3. The apparatus according to claim 1, wherein the optical heads are arrayed in multiple parallel rows, and wherein the motion assembly is configured to shift the calibration assembly in directions both parallel and perpendicular to the rows.

4. The apparatus according to claim 1, wherein the optical heads project the respective patterns along respective optical axes toward the workpiece, and wherein the calibration assembly comprises a calibration camera, having a camera optical axis non-parallel to the optical axes of the optical heads, and a reflector, which is configured to intercept the optical axes of the optical heads and to deflect the projected patterns toward the camera.

5. The apparatus according to claim 4, wherein the optical heads have a focal plane at the workpiece, and wherein the calibration camera comprises an image sensor, and wherein the reflector and the calibration camera are positioned so that the image sensor is located in the focal plane of the optical heads.

6. The apparatus according to claim 5, and comprising a registration target, which is fixed to the mount in the focal plane of the optical heads and is configured to respond to the radiation projected by the optical heads, and wherein the apparatus comprises a registration camera, which is positioned to capture a registration image of the registration target, and the processor is configured to process the registration image so as to calibrate respective positions of the optical heads.

7. The apparatus according to claim 5, wherein the calibration camera has a camera axis that is perpendicular to a plane of the image sensor, and wherein the reflector is configured to deflect the projected patterns to impinge on the image sensor along a deflected axis that is slanted relative to the camera axis.

8. The apparatus according to claim 7, wherein the motion assembly is configured to shift the calibration camera in a direction transverse to the deflected axis, so that the calibration camera captures the images of the projected pattern from each optical head at multiple transverse locations, and wherein the processor is configured to process the images captured at the multiple transverse locations so as to assess a focal property of the projected pattern.

9. The apparatus according to claim 1, wherein the respective patterns are characterized by a pattern pixel size, and wherein the calibration assembly comprises a calibration camera, which is configured to form images of the patterns having an image pixel size that is no greater than the pattern pixel size.

10. The apparatus according to claim 1, wherein the calibration assembly further comprises a power meter, which is configured to measure an intensity of the projected radiation.

11. An optical apparatus, comprising:
    a mount, which is configured to hold a workpiece;
    an array of optical heads, which are configured to project respective patterns of radiation onto the workpiece;
    a registration target, comprising an erasable photochromic element, which is located on the mount and is configured to respond to the radiation projected by the optical heads;
    a registration camera, which is positioned to capture an image of the registration target; and
    a processor, which is configured to process the image so as to calibrate respective positions of the patterns projected by the optical heads relative to the workpiece.

12. A method for calibration of optical apparatus that includes a mount, which holds a workpiece, and an array of optical heads, which project respective patterns of radiation onto the workpiece, the method comprising:

capturing, using a calibration assembly, images of the respective patterns projected by the optical heads;

moving the calibration assembly, with respect to the optical heads, among a plurality of different positions, each position disposed on an optical path between the array of the optical heads and the mount, so that the calibration assembly intercepts and images, at each of the different positions, a respective pattern projected by a different one of the optical heads; and processing the images captured by the calibration assembly at the different positions so as to monitor operation of the apparatus.

13. The method according to claim 12, wherein transporting the calibration assembly comprises moving the calibration assembly after completion of a calibration procedure to a rest location, where the calibration assembly does not intercept the patterns projected by any of the optical heads.

14. The method according to claim 12, wherein the optical heads are arrayed in multiple parallel rows, and wherein moving the calibration assembly comprises shifting the calibration assembly in directions both parallel and perpendicular to the rows in order to capture the images from the optical heads in the multiple rows.

15. The method according to claim 12, wherein the optical heads project the respective patterns along respective optical axes toward the workpiece, and wherein capturing the images comprises positioning a reflector to intercept the optical axes of the optical heads and to deflect the projected patterns toward a calibration camera having a camera optical axis non-parallel to the optical axes of the optical heads.

16. The method according to claim 15, wherein the optical heads have a focal plane at the workpiece, and wherein the calibration camera comprises an image sensor, and wherein capturing the images comprises positioning the reflector and the calibration camera so that the image sensor is located in the focal plane of the optical heads.

17. The method according to claim 16, and comprising fixing to the mount, in the focal plane of the optical heads, a registration target configured to respond to the radiation projected by the optical heads, and wherein the method comprises capturing a registration image of the registration target, and processing the registration image so as to calibrate respective positions of the optical heads.

18. The method according to claim 16, wherein the calibration camera has a camera axis that is perpendicular to a plane of the image sensor, and wherein capturing the images comprises positioning the reflector so as to deflect the projected patterns to impinge on the image sensor along a deflected axis that is slanted relative to the camera axis.

19. The method according to claim 18, wherein transporting the calibration assembly comprises shifting the calibration camera in a direction transverse to the deflected axis, so that the calibration camera captures the images of the projected pattern from each optical head at multiple transverse locations, and wherein processing the images comprises evaluating the images captured at the multiple transverse locations so as to assess a focal property of the projected pattern.

20. The method according to claim 12, wherein the respective patterns are characterized by a pattern pixel size, and wherein capturing the images comprises forming images of the patterns having an image pixel size that is no greater than the pattern pixel size.

21. The method according to claim 12, and comprising measuring, using a power meter in the calibration assembly, an intensity of the projected radiation.

22. A method for calibration of optical apparatus that includes a mount, which holds a workpiece, and an array of optical heads, which project respective patterns of radiation onto the workpiece, the method comprising:

placing on the mount a registration target, comprising an erasable photochromic element, which is configured to respond to the radiation projected by the optical heads;

capturing an image of the registration target; and processing the image so as to calibrate respective positions of the patterns projected by the optical heads relative to the workpiece.

23. The method according to claim 22, wherein the method comprises erasing and reusing the photochromic element after capturing the image.

* * * * *